US006986850B2

(12) United States Patent
Rolfson

(10) Patent No.: US 6,986,850 B2
(45) Date of Patent: Jan. 17, 2006

(54) PARTIAL EDGE BEAD REMOVAL TO ALLOW IMPROVED GROUNDING DURING E-BEAM MASK WRITING

(75) Inventor: J. Brett Rolfson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 224 days.

(21) Appl. No.: 10/614,529

(22) Filed: Jul. 7, 2003

(65) Prior Publication Data

US 2005/0008943 A1 Jan. 13, 2005

(51) Int. Cl.
*B44C 1/22* (2006.01)
*C25F 3/00* (2006.01)
*G03F 1/00* (2006.01)
(52) U.S. Cl. ............................................ 216/12; 430/5
(58) Field of Classification Search ............... 216/2, 216/12, 41–54; 430/4, 5, 256, 269, 291, 430/292, 296–331, 942–952; 156/247, 345.1, 156/345.17, 345.19; 355/78, 152; 438/689
See application file for complete search history.

(56) References Cited

U.S. PATENT DOCUMENTS

| 5,804,336 | A | 9/1998 | Rolfson | 430/5 |
| 6,261,427 | B1 | 7/2001 | Rolfson | 204/224 |
| 6,830,853 | B1 * | 12/2004 | Tzu et al. | 430/5 |
| 2005/0032003 | A1 * | 2/2005 | Lin | 430/322 |

FOREIGN PATENT DOCUMENTS

JP 05289309 A * 11/1993

* cited by examiner

*Primary Examiner*—Parviz Hassanzadeh
*Assistant Examiner*—Roberts Culbert
(74) *Attorney, Agent, or Firm*—Whyte Hirschboeck Dudek S.C.

(57) ABSTRACT

A method to provide a ground point for second, or subsequent, e-beam mask-writing steps by selectively removing the photoresist edge bead of a photomask substrate to expose the underlying chrome layer. The selective removal leaves at least one tab of photoresist edge bead over the chrome layer. After the first e-beam mask writing step and subsequent etch, the tab can be removed to expose a portion of the chromium layer that can act as a new ground point for a second e-beam etch. Also, a nozzle for use in selectively removing the edge bead to leave a tab of photoresist edge bead.

108 Claims, 3 Drawing Sheets

PARTIAL EDGE BEAD REMOVAL TO ALLOW IMPROVED GROUNDING DURING E-BEAM MASK WRITING

BACKGROUND OF THE INVENTION

The present invention relates to fabricating a photomask used in a photolithography process and, more specifically, to a method and apparatus for removing an edge bead from a photomask.

A photomask may be used to transfer a pattern onto a semiconductor wafer. The pattern which is to be transferred onto the wafer may be formed on a material, such as glass or quartz, which is substantially transparent. The material of the photomask may also include thin films of metal or other nontransparent material that prevent light from passing through selected portions of the photomask. In typical photomasks, the nontransparent material is opaque chrome.

Due to limitations imposed by the wavelength of light used to transfer the pattern, resolution degrades at the edges of the patterns of the photomask. Phase-shifting photomasks increase the resolution of patterns by creating phase-shifting regions in the transparent areas of a photomask. One type of phase-shifting mask is known as an "attenuated" or "half-tone" phase-shift mask. In this type of mask, the transparent regions transmit approximately 100% of the incident radiation, similar to the strong phase-shifting mask. However, the transparent areas are in-phase. The "phase-shifting" feature of an attenuated phase-shift mask is due to the fact that the opaque regions of the hard shifters are replaced with areas that are slightly transmissive, and act to shift light transmitted by 180°. Transmission of this incident radiation is typically in the 6–9% range for these masks.

Depending on the process used, an attenuating phase-shift mask may only require a single maskwriting step (similar to a binary mask). However, other processes may be used which require two or more maskwriting steps in order to create desired features, such as an opaque border region. At the present time, single-write processes, without the opaque border, have not been successful in photolithography steppers which use longer wavelengths for alignment or reticle identification, due to the material constraints of the pattern material.

Several methods of fabricating a photomask having an opaque layer on the border of the mask are known in the art. One process requires two mask-writing steps. First, a primary mask pattern is written and etched to the underlying substrate of the mask blank, the photoresist is stripped, and the mask blank is re-coated. Second, an opaque layer is written onto the border of the mask.

One drawback of the two mask-writing steps process is that the first chromium etch removes all exposed chrome. The subsequent lack of exposed chrome makes obtaining a good ground for the second e-beam write difficult without extensive write tool modification. Therefore, there is a need for a two mask-writing steps process that facilitates grounding the e-beam for the second mask-writing step.

BRIEF SUMMARY OF THE INVENTION

The current invention is a method for facilitating second, and subsequent, mask-writing steps by protecting potential grounding points from etching. The invention also includes a nozzle tool useful in conducting the method.

In one preferred embodiment, the invention is a method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; selectively removing the photoresist material from portions of the workpiece adjacent to the periphery to expose the chrome layer while leaving at least one tab of photoresist material covering the chrome layer adjacent to the periphery; removing the exposed chrome layer; removing the tab of photoresist material, or removing at least one tab if more than one tab is present; and removing the exposed chrome layer.

In another preferred embodiment, the invention is a method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; providing a nozzle tool comprising: a first nozzle adapted to apply a solvent to the top surface of the workpiece adjacent to the periphery; a second nozzle adapted to apply a solvent to the edge of the workpiece; a third nozzle adapted to apply a solvent to the bottom surface of the workpiece adjacent to the periphery, wherein each nozzle may be independently controlled; controlling the first, second and third nozzles to selectively apply solvent to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery; removing the exposed chrome layer; removing the tab of photoresist material, or removing at least one tab if more than one tab is present; and removing the exposed chrome layer.

In another preferred embodiment a method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; providing a nozzle tool comprising: means to apply a solvent to the top surface of the workpiece adjacent to the periphery; means to remove the solvent from the edge of the workpiece; and means to apply the solvent to the bottom surface of the workpiece adjacent to the periphery, wherein each means to apply and remove a solvent may be independently controlled; selectively applying and removing solvent by means of the nozzle tool to the top surface and bottom surface of the workpiece thereby removing the photoresist material from portions of the workpiece adjacent to the periphery to expose the chrome layer while leaving at least one tab of photoresist material covering the chrome layer adjacent to the periphery; removing the exposed chrome layer; removing the tab of photoresist material, or removing at least one tab if more than one tab is present; and removing the exposed chrome layer.

In another preferred embodiment, the invention is a method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; providing a nozzle tool comprising: a first nozzle and vacuum means adapted to apply and remove a solvent to the top surface of the workpiece adjacent to the periphery; a second nozzle and vacuum means adapted to apply and remove a solvent to the edge of the workpiece; a third nozzle and vacuum means adapted to apply and remove a solvent to the bottom surface of the workpiece adjacent to the periphery, wherein each nozzle may be independently controlled; controlling the first nozzle and vacuum means, the second nozzle and vacuum means and the third nozzle and vacuum means to selectively apply and remove solvent to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery; removing the exposed chrome layer; removing the tab of photoresist material, or removing at least one tab if more than one tab is present; and removing the exposed chrome layer.

A method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; providing a nozzle tool comprising: a first nozzle adapted to apply a solvent to the top surface of the workpiece adjacent to the periphery; a second nozzle adapted to apply a solvent to the bottom surface of the workpiece adjacent to the periphery, wherein each nozzle may be independently controlled; controlling the first and second nozzles to selectively apply solvent to the top surface and bottom surface of the workpiece thereby removing the photoresist material from portions of the workpiece adjacent to the periphery to expose the chrome layer while leaving at least one tab of photoresist material covering the chrome layer adjacent to the periphery; removing the exposed chrome layer; removing the tab of photoresist material, or removing at least one tab if more than one tab is present; and removing the exposed chrome layer.

In another preferred embodiment, the invention is a method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; selectively removing the photoresist material from portions of the workpiece adjacent to the periphery to expose the chrome layer while leaving at least one tab of photoresist material covering the chrome layer adjacent to the periphery; selectively removing photoresist material nonadjacent to the periphery to expose the chrome layer in a first pattern; removing the exposed chrome layer; removing the tab of photoresist material, or removing one tab if more than one tab is present; selectively removing photoresist material nonadjacent to the periphery to expose the chrome layer in a second pattern; and removing the exposed chrome layer.

A method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; providing a nozzle tool comprising: a first nozzle adapted to apply a solvent to the top surface of the workpiece adjacent to the periphery; a second nozzle adapted to apply a solvent to the bottom surface of the workpiece; a vacuum means adapted to remove a solvent from the edge of the workpiece adjacent to the periphery, wherein each nozzle may be independently controlled; controlling the first nozzle, the second nozzle and the vacuum means to selectively apply and remove solvent to the top surface and bottom surface of the workpiece thereby removing the photoresist material from portions of the workpiece adjacent to the periphery to expose the chrome layer while leaving at least one tab of photoresist material covering the chrome layer adjacent to the periphery; removing the exposed chrome layer; removing the tab of photoresist material, or removing at least one tab if more than one tab is present; and removing the exposed chrome layer.

In still another preferred embodiment, the invention is a method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; providing a nozzle tool comprising: means to apply and remove a solvent to the top surface of the workpiece adjacent to the periphery; means to apply and remove the solvent from the edge of the workpiece; and means to apply and remove the solvent from the bottom surface of the workpiece adjacent to the periphery, wherein each means to apply and remove a solvent may be independently controlled; selectively applying and removing solvent to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery; selectively removing photoresist material nonadjacent to the periphery to expose the chrome layer in a first pattern; removing the exposed chrome layer; removing the tab of photoresist material, or removing one tab if more than one tab is present; selectively removing photoresist material nonadjacent to the periphery to expose the chrome layer in a second pattern; and removing the exposed chrome layer.

A method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; providing a nozzle tool comprising: means to apply a solvent to the top surface of the workpiece adjacent to the periphery; means to remove the solvent from the edge of the workpiece; and means to apply the solvent to the bottom surface of the workpiece adjacent to the periphery, wherein each means to apply and remove a solvent may be independently controlled; selectively applying solvent to the top surface and bottom surface of the workpiece and removing the solvent from the edge of the workpiece thereby removing the photoresist material from portions of the workpiece adjacent to the periphery to expose the chrome layer while leaving at least one tab of photoresist material covering the chrome layer adjacent to the periphery; selectively removing photoresist material nonadjacent to the periphery to expose the chrome layer in a first pattern; removing the exposed chrome layer; removing the tab of photoresist material, or removing one tab if more than one tab is present; selectively removing photoresist material nonadjacent to the periphery to expose the chrome layer in a second pattern; and removing the exposed chrome layer.

In yet another preferred embodiment, the invention is a method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; providing a nozzle tool comprising: a first nozzle adapted to apply a solvent to the top surface of the workpiece adjacent to the periphery; a second nozzle adapted to apply a solvent to the edge of the workpiece; a third nozzle adapted to apply a solvent to the bottom surface of the workpiece adjacent to the periphery, wherein each nozzle may be independently controlled; controlling the first, second and third nozzles to selectively apply solvent to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery; selectively removing photoresist material nonadjacent to the periphery to expose the chrome layer in a first pattern; removing the exposed chrome layer; removing the tab of photoresist material, or removing one tab if more than one tab is present; selectively removing photoresist material nonadjacent to the periphery to expose the chrome layer in a second pattern; and removing the exposed chrome layer.

A method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; providing a nozzle tool comprising a first nozzle adapted to apply a solvent to the top surface of the workpiece adjacent to the periphery; a second nozzle adapted to remove the solvent from the edge of the workpiece; a third nozzle adapted to apply a solvent to the bottom surface of the workpiece adjacent to the periphery, wherein each nozzle may be independently controlled; controlling the first, second and third nozzles to selectively apply and remove solvent to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery; selectively removing photoresist material nonadjacent to the periphery to expose the chrome layer in a first pattern; removing the exposed chrome layer; removing the tab of photoresist material, or removing one tab if more than one tab is present; selectively removing photoresist material nonadjacent to the periphery to expose the chrome layer in a second pattern; and removing the exposed chrome layer.

In another preferred embodiment, the invention is a method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; providing a nozzle tool comprising: a first nozzle and vacuum means adapted to apply and remove a solvent to the top surface of the workpiece adjacent to the periphery; a second nozzle and vacuum means adapted to apply and remove a solvent to the edge of the workpiece; a third nozzle and vacuum means adapted to apply and remove a solvent to the bottom surface of the workpiece adjacent to the periphery, wherein each nozzle may be independently controlled; controlling the first nozzle and vacuum means, the second nozzle and vacuum means and the third nozzle and vacuum means to selectively apply and remove solvent to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery; selectively removing photoresist material nonadjacent to the periphery to expose the chrome layer in a first pattern; removing the exposed chrome layer; removing the tab of photoresist material, or removing one tab if more than one tab is present; selectively removing photoresist material nonadjacent to the periphery to expose the chrome layer in a second pattern; and removing the exposed chrome layer.

A method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; providing a nozzle tool comprising a first nozzle adapted to apply and remove a solvent to the top surface of the workpiece adjacent to the periphery; a vacuum means adapted to remove a solvent to the edge of the workpiece; a second nozzle and vacuum means adapted to apply a solvent to the bottom surface of the workpiece adjacent to the periphery, wherein each nozzle may be independently controlled; controlling the first nozzle, the second nozzle and the vacuum means to selectively apply solvent to the top surface and bottom surface of the workpiece and remove solvent from the edge of the workpiece thereby removing the photoresist material from portions of the workpiece adjacent to the periphery to expose the chrome layer while leaving at least one tab of photoresist material covering the chrome layer adjacent to the periphery; selectively removing photoresist material nonadjacent to the periphery to expose the chrome layer in a first pattern; removing the exposed chrome layer; removing the tab of photoresist material, or removing one tab if more than one tab is present; selectively removing photoresist material nonadjacent to the periphery to expose the chrome layer in a second pattern; and removing the exposed chrome layer.

In another preferred embodiment, the invention is a nozzle tool for removing a material from a workpiece having a top surface and bottom surface and an edge, defining a periphery, connecting the top and bottom surfaces, the tool comprising first means to apply and remove a solvent for the material, the first means being adapted to apply and remove the solvent to the top surface of the workpiece adjacent to the periphery; second means to apply and remove the solvent, the second means being adapted to apply and remove the solvent to the edge of the workpiece; and third means to apply and remove the solvent, the third means being adapted to apply and remove the solvent to the bottom surface of the workpiece adjacent to the periphery, wherein each means to apply and remove the solvent may be independently controlled.

A nozzle tool for removing a material from a workpiece having a top surface and bottom surface and an edge, defining a periphery, connecting the top and bottom surfaces, the tool comprising: first means to apply a solvent for the material, the first means being adapted to apply the solvent to the top surface of the workpiece adjacent to the periphery; second means to apply the solvent, the second means being adapted to apply the solvent to the bottom surface of the workpiece; and means to remove the solvent, the removal means being adapted to remove the solvent from the edge of the workpiece adjacent to the periphery, wherein each means to apply and remove the solvent may be independently controlled.

In still another preferred embodiment, the invention is a nozzle tool for removing a material from a workpiece having a top surface and bottom surface and an edge, defining a periphery, connecting the top and bottom surfaces, the tool comprising a first nozzle and vacuum means adapted to apply and remove a solvent to the top surface of the workpiece adjacent to the periphery; a second nozzle and vacuum means adapted to apply and remove a solvent to the edge of the workpiece; a third nozzle and vacuum means adapted to apply and remove a solvent to the bottom surface of the workpiece adjacent to the periphery, wherein each nozzle may be independently controlled.

A nozzle tool for removing a material from a workpiece having a top surface and bottom surface and an edge, defining a periphery, connecting the top and bottom surfaces, the tool comprising: a first nozzle adapted to apply a solvent to the top surface of the workpiece adjacent to the periphery; a vacuum means adapted to remove a solvent to the edge of the workpiece; a second nozzle means adapted to apply a solvent to the bottom surface of the workpiece adjacent to the periphery, wherein each nozzle may be independently controlled.

In yet another preferred embodiment, the invention is a method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; applying and removing a solvent selectively to the top surface, bottom surface and edge to dissolve the photoresist material from portions of the workpiece adjacent to the periphery to expose the chrome layer while leaving at least one tab of photoresist material covering the chrome layer adjacent to the periphery; removing the exposed chrome layer; removing the tab of photoresist material, or removing at least one tab if more than one tab is present; and removing the exposed chrome layer.

In yet another preferred embodiment, the invention is a method for making a photomask, the method comprising the steps of providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer; applying and removing a solvent selectively to the top surface, bottom surface and edge to dissolve the photoresist material from portions of the workpiece adjacent to the periphery to expose the chrome layer while leaving at least one tab of photoresist material covering the chrome layer adjacent to the periphery; selectively removing photoresist material nonadjacent to the periphery to expose the chrome layer in a first pattern; removing the exposed chrome layer; removing the tab of photoresist material, or removing at least one tab if more than one tab is present; selectively removing photoresist material adjacent to the periphery to expose the chrome layer in a second pattern; and removing the exposed chrome layer.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

DETAILED DESCRIPTION OF THE INVENTION

In the following detailed description, references made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that sequence or structural changes may be made without departing from the spirit and scope of the present invention.

Figure 1:
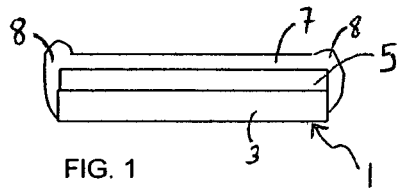
FIG. 1 shows a side schematic view of a photomask plate suitable for use in the current invention.
Figure 2:
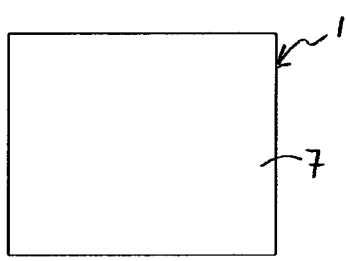
FIG. 2 shows an overhead view of the plate of FIG. 1.

A typical photomask plate 1 usable in the current inventive edge bead removal process is shown in FIGS. 1 and 2. As shown in FIG. 1 the photomask plate consists of a substrate 3 underlying a chromium layer 5. Substrate 3 typically comprises glass (e.g., borosilicate glass) or fused silica (also called "quartz"), preferably quartz. Chromium layer 5 may be a deposition layer of chromium or may be chromium sandwiched between an underlying "glue" layer (not shown), which typically consists of chromium, nitrogen and oxygen, and a top layer of chromium oxide, $Cr_2O_3$. Chromium layer 5 may also be a "leaky chrome" comprising, for example, chrome/oxy/nitride, a form of $MoSi_2$ capped by chromium or other such material. For use as a photomask, a pattern (not shown) is etched in chromium layer 5. A photoresist layer 7 is typically applied during the formation of the pattern in layer 5. Typically, photoresist layer 7 is applied by spin coating the photoresist polymer onto the top of chromium layer 5 superimposing substrate 3. The spin coating process generally results in an edge bead 8 forming around the periphery of the photomask plate 1. Edge bead 8 has an undesirable thickness and/or quality. The edge bead 8 is frequently thicker than the photoresist layer 7 and the edge bead 8 may also extend along the edge 9 of photomask plate 1 and also on the underside of substrate 3. As shown in FIG. 2, photoresist layer 7 completely covers photomask 1 following the spin coating process.

Figure 3:
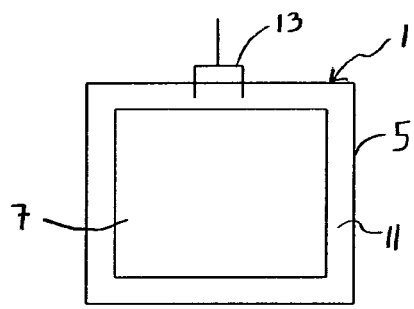
FIG. 3 is an overhead view of the plate of FIG. 2 following a prior art edge bead removal process.
Figure 4:
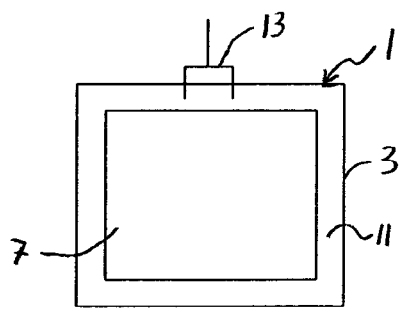
FIG. 4 is an overhead view of the plate of FIG. 3 following a chromium etch.

A typical prior art edge bead removal process is shown in FIGS. 3 and 4. As shown in FIG. 3, edge bead 8 and material from photoresist layer 7 is removed over a peripheral area 11 of photomask plate 1 thereby exposing a section of chromium layer 5. Contact points 13 provide grounding contact between chromium layer 5 and an e-beam. A pattern (not shown) is written into photoresist layer 7 by means of the e-beam. Subsequent to exposure of the resist by the e-beam photomask plate 1 is wet-etched or dry-etched to remove the exposed chromium thereby engraving the pattern into the chromium layer 5. This results in a photomask 1 as shown in FIG. 4 wherein peripheral area 11 of photomask 1 now exposes substrate 3 rather than chromium layer 5. As such, e-beam contact points 13 can no longer form a ground for subsequent e-beam writing.

Figure 5:
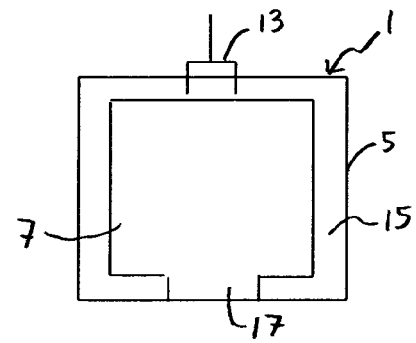
FIG. 5 is an overhead view of the plate of FIG. 2 following the inventive edge bead removal process.
Figure 6:
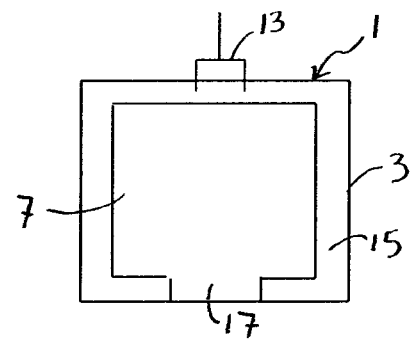
FIG. 6 is an overhead view of the plate of FIG. 5 following a chromium etch.
Figure 7:
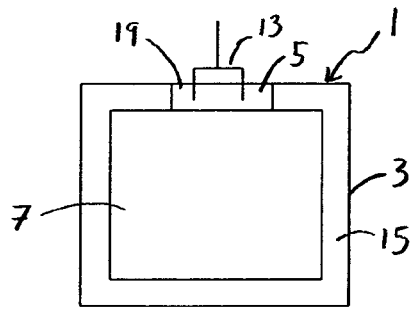
FIG. 7 is an overhead view of the plate of FIG. 6 following a second edge bead removal step and rotation of the plate 180°.

In the inventive edge bead removal process the edge bead 8 is only partially removed as shown in FIG. 5. An area 15 of chromium layer 5 is exposed around the perimeter of photomask 1. At least one tab 17 of photoresist 7 is left covering chromium layer 5. Following e-beam writing and wet or dry chromium etching photomask 1 appears as shown in FIG. 6. Chromium layer 5 has been removed from exposed section 15 revealing substrate 3. Tab 17 may then be removed exposing section 19 of chromium layer 5 as shown in FIG. 7. In FIG. 7 photomask plate 1 has been rotated 180° so that chromium layer 5 of section 19 provides grounding contact to e-beam contact points 13. This permits a second e-beam write into photoresist 7 followed by subsequent chromium etching. Other tab 17 could be left to provide ground points for additional writes.

Figure 8:
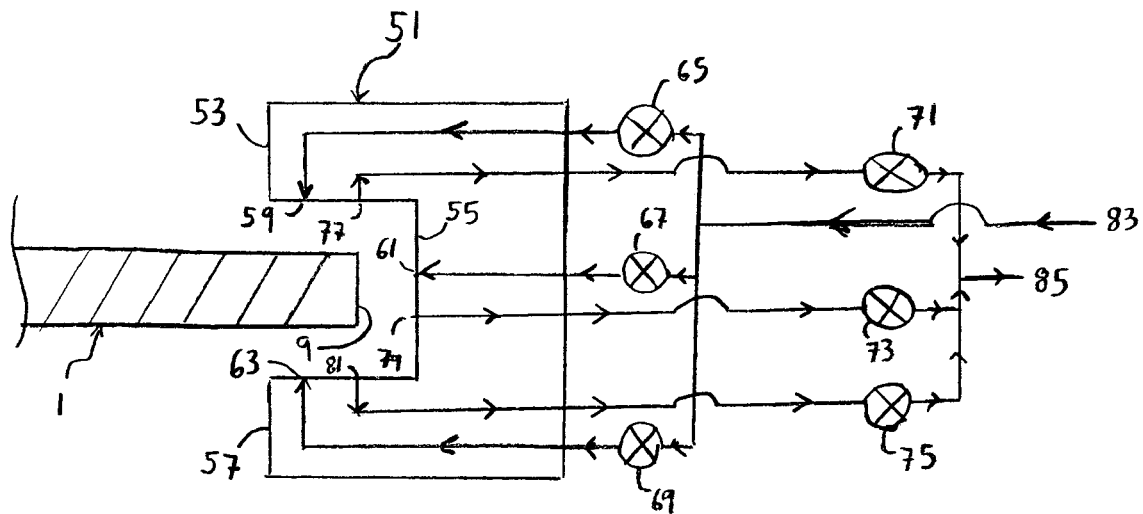
FIG. 8 is a side schematic view of a nozzle suitable for use in the inventive edge bead removal process.
Figure 9:
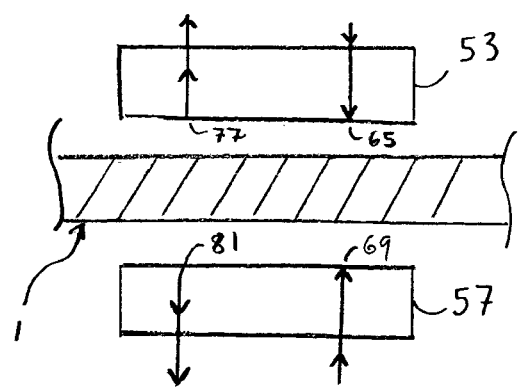
FIG. 9 is a front schematic view of the nozzle of FIG. 8.

The inventive edge bead removal process may conveniently be conducted using a nozzle as shown in FIG. 8. Nozzle 51 has top 53, side 55 and bottom 57 nozzle sections. As shown, the nozzle is designed to surround, but not touch, photomask plate 1. The nozzle can apply an edge bead removal solution to the top side, bottom side, and edge 9 of photomask plate 1. Flow from the edge bead removal solution supply 83 to top nozzle 59, side nozzle 61 and bottom nozzle 63 may independently be controlled by means of control valves 65, 67 and 69, respectively. The edge bead removal solution, along with dissolved photoresist resin is removed by means of a vacuum. Top vacuum opening 77, side vacuum opening 79 and bottom vacuum opening 81 are connected to a vacuum supply 85 and are independently controlled by control valves 71, 73 and 75, respectively. As shown in FIG. 9, the edge bead removal solution is applied through the leading edge of the nozzle in the edge bead removal solution and dissolved photoresist polymer are removed by vacuum located on the trailing edge of the nozzle. The leading edge and the trailing edge are defined by relative plate movement because the nozzle can operate either by moving the nozzle fixture relative to the plate or moving the plate relative to the nozzle or both.

Figure 10:
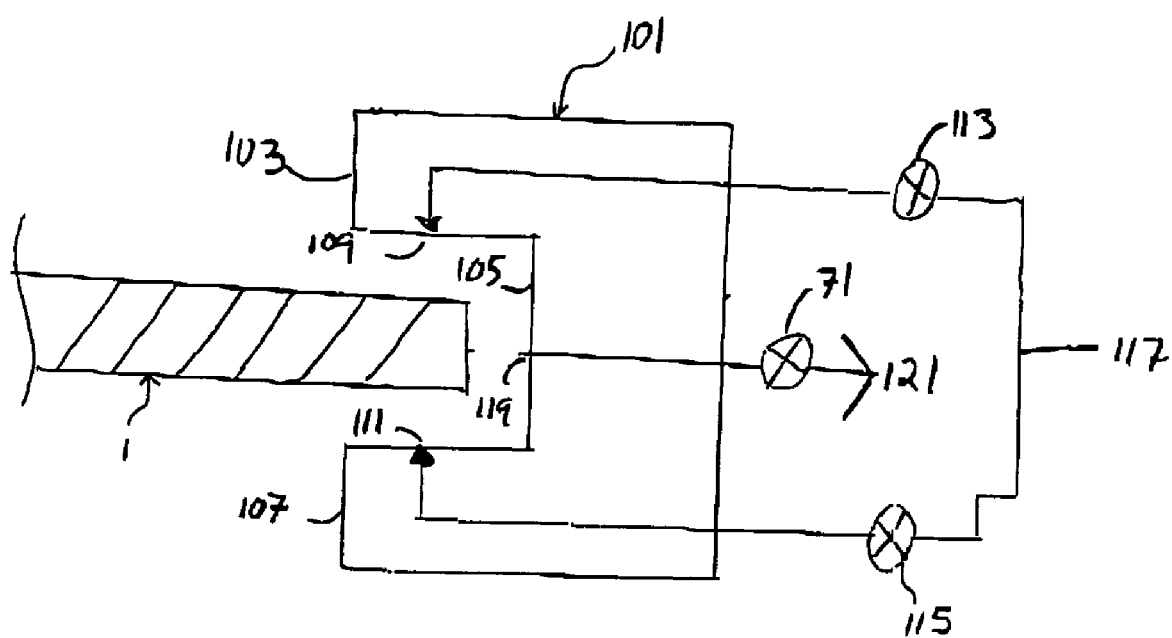
FIG. 10 is a side schematic view of another embodiment of nozzle suitable for use in the inventive edge bead removal process.

Another embodiment of a nozzle useful for the inventive edge bead removal process is shown in FIG. 10. Nozzle 101 has top 103, side 105 and bottom 107 nozzle sections. As shown, the nozzle is designed to surround, but not touch, photomask plate 1. The nozzle 101 can apply an edge bead removal solution to the top side and bottom side of photomask plate 1. Flow from the edge bead removal solution supply 117 to top nozzle 109 and bottom nozzle 111 may independently be controlled by means of control valves 113 and 115, respectively. The edge bead removal solution, along with dissolved photoresist resin is removed by means of a vacuum. A side vacuum opening 119 is connected to a vacuum supply 121 and controlled by control valves 71.

Nozzle 101 can be a different physical embodiment than nozzle 51. Alternatively, nozzle 51 can be operated as nozzle 101 by closing edge bead removal solution control valve 67 and vacuum supply control valves 71 and 75.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for making a photomask, the method comprising the steps of:
   providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;
   selectively removing the photoresist material from portions of the workpiece adjacent to the periphery to expose the chrome layer while leaving at least one tab of photoresist material covering the chrome layer adjacent to the periphery;
   removing the exposed chrome layer;
   removing the tab of photoresist material, or removing at least one tab if more than one tab is present; and
   removing the exposed chrome layer.

2. The method of claim 1, wherein the substrate comprises borosilicate glass or fused silica.

3. The method of claim 1, wherein the chrome comprises at least one of the group consisting of chromium, chromium oxide, and a chromium/nitrogen/oxygen containing compound.

4. The method of claim 1, wherein the exposed chrome is removed by a dry etch.

5. The method of claim 1, wherein the exposed chrome is removed by a wet etch.

6. A method for making a photomask, the method comprising the steps of:
   providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;

providing a nozzle tool comprising: means to apply and remove a solvent to the top surface of the workpiece adjacent to the periphery; means to apply and remove the solvent from the edge of the workpiece; and means to apply and remove the solvent from the bottom surface of the workpiece adjacent to the periphery, wherein each means to apply and remove a solvent may be independently controlled;

selectively applying and removing solvent by means of the nozzle tool to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery;

removing the exposed chrome layer;

removing the tab of photoresist material, or removing at least one tab if more than one tab is present; and removing the exposed chrome layer.

7. The method of claim 6, wherein the substrate comprises borosilicate glass or fused silica.

8. The method of claim 6, wherein the chrome comprises at least one of the group consisting of chromium, chromium oxide, and a chromium/nitrogen/oxygen containing compound.

9. The method of claim 6, wherein the exposed chrome is removed by a dry etch.

10. The method of claim 6, wherein the exposed chrome is removed by a wet etch.

11. A method for making a photomask, the method comprising the steps of:

providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;

providing a nozzle tool comprising: a first nozzle adapted to apply a solvent to the top surface of the workpiece adjacent to the periphery; a second nozzle adapted to apply a solvent to the edge of the workpiece; a third nozzle adapted to apply a solvent to the bottom surface of the workpiece adjacent to the periphery, wherein each nozzle may be independently controlled;

controlling the first, second and third nozzles to selectively apply solvent to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery;

removing the exposed chrome layer;

removing the tab of photoresist material, or removing at least one tab if more than one tab is present; and removing the exposed chrome layer.

12. The method of claim 11, wherein the substrate comprises borosilicate glass or fused silica.

13. The method of claim 11, wherein the chrome comprises at least one of the group consisting of chromium, chromium oxide, and a chromium/nitrogen/oxygen containing compound.

14. The method of claim 11, wherein the exposed chrome is removed by a dry etch.

15. The method of claim 11, wherein the exposed chrome is removed by a wet etch.

16. A method for making a photomask, the method comprising the steps of:

providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;

providing a nozzle tool comprising: a first nozzle and vacuum means adapted to apply and remove a solvent to the top surface of the workpiece adjacent to the periphery; a second nozzle and vacuum means adapted to apply and remove a solvent to the edge of the workpiece; a third nozzle and vacuum means adapted to apply and remove a solvent to the bottom surface of the workpiece adjacent to the periphery, wherein each nozzle may be independently controlled;

controlling the first nozzle and vacuum means, the second nozzle and vacuum means and the third nozzle and vacuum means to selectively apply and remove solvent to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery;

removing the exposed chrome layer;

removing the tab of photoresist material, or removing at least one tab if more than one tab is present; and removing the exposed chrome layer.

17. The method of claim 16, wherein the substrate comprises borosilicate glass or fused silica.

18. The method of claim 16, wherein the chrome comprises at least one of the group consisting of chromium, chromium oxide, and a chromium/nitrogen/oxygen containing compound.

19. The method of claim 16, wherein the exposed chrome is removed by a dry etch.

20. The method of claim 16, wherein the exposed chrome is removed by a wet etch.

21. A method for making a photomask, the method comprising the steps of:

providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;

selectively removing the photoresist material from portions of the workpiece adjacent to the periphery to expose the chrome layer while leaving at least one tab of photoresist material covering the chrome layer adjacent to the periphery;

selectively removing photoresist material nonadjacent to the periphery to expose the chrome layer in a first pattern;

removing the exposed chrome layer;

removing the tab of photoresist material, or removing one tab if more than one tab is present;

selectively removing photoresist material nonadjacent to the periphery to expose the chrome layer in a second pattern; and removing the exposed chrome layer.

22. The method of claim 21, wherein the substrate comprises borosilicate glass or fused silica.

23. The method of claim 21, wherein the chrome comprises at least one of the group consisting of chromium, chromium oxide, and a chromium/nitrogen/oxygen containing compound.

24. The method of claim 21, wherein the exposed chrome is removed by a dry etch.

25. The method of claim 21, wherein the exposed chrome is removed by a wet etch.

26. The method of claim 21, wherein the first pattern is formed by writing the pattern into the photoresist with an e-beam.

27. The method of claim 21, wherein the second pattern is formed by writing the pattern into the photoresist with an e-beam.

28. The method of claim 27, wherein the e-beam is grounded to the exposed chrome layer.

29. The method of claim 28, wherein the e-beam is grounded to the chrome layer exposed by removal of the tab.

30. A method for making a photomask, the method comprising the steps of:
providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;
providing a nozzle tool comprising: means to apply and remove a solvent to the top surface of the workpiece adjacent to the periphery; means to apply and remove the solvent from the edge of the workpiece; and means to apply and remove the solvent from the bottom surface of the workpiece adjacent to the periphery, wherein each means to apply and remove a solvent may be independently controlled;
selectively applying and removing solvent to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery;
selectively removing photoresist material nonadjacent to the periphery to expose the chrome layer in a first pattern;
removing the exposed chrome layer;
removing the tab of photoresist material, or removing one tab if more than one tab is present;
selectively removing photoresist material nonadjacent to the periphery to expose the chrome layer in a second pattern; and
removing the exposed chrome layer.

31. The method of claim 30, wherein the substrate comprises borosilicate glass or fused silica.

32. The method of claim 30, wherein the chrome comprises at least one of the group consisting of chromium, chromium oxide, and a chromium/nitrogen/oxygen containing compound.

33. The method of claim 30, wherein the exposed chrome is removed by a dry etch.

34. The method of claim 30, wherein the exposed chrome is removed by a wet etch.

35. The method of claim 30, wherein the first pattern is formed by writing the pattern into the photoresist with an e-beam.

36. The method of claim 30, wherein the second pattern is formed by writing the pattern into the photoresist with an e-beam.

37. The method of claim 35, wherein the e-beam is grounded to the exposed chrome layer.

38. The method of claim 36, wherein the e-beam is grounded to the chrome layer exposed by removal of the tab.

39. A method for making a photomask, the method comprising the steps of:
providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;
providing a nozzle tool comprising: a first nozzle adapted to apply a solvent to the top surface of the workpiece adjacent to the periphery; a second nozzle adapted to apply a solvent to the edge of the workpiece; a third nozzle adapted to apply a solvent to the bottom surface of the workpiece adjacent to the periphery, wherein each nozzle may be independently controlled;
controlling the first, second and third nozzles to selectively apply solvent to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery;
selectively removing photoresist material nonadjacent to the periphery to expose the chrome layer in a first pattern;
removing the exposed chrome layer;
removing the tab of photoresist material, or removing one tab if more than one tab is present;
selectively removing photoresist material nonadjacent to the periphery to expose the chrome layer in a second pattern; and
removing the exposed chrome layer.

40. The method of claim 39, wherein the substrate comprises borosilicate glass or fused silica.

41. The method of claim 39, wherein the chrome comprises at least one of the group consisting of chromium, chromium oxide, and a chromium/nitrogen/oxygen containing compound.

42. The method of claim 39, wherein the exposed chrome is removed by a dry etch.

43. The method of claim 39, wherein the exposed chrome is removed by a wet etch.

44. The method of claim 39, wherein the first pattern is formed by writing the pattern into the photoresist with an e-beam.

45. The method of claim 39, wherein the second pattern is formed by writing the pattern into the photoresist with an e-beam.

46. The method of claim 44, wherein the e-beam is grounded to the exposed chrome layer.

47. The method of claim 46, wherein the e-beam is grounded to the chrome layer exposed by removal of the tab.

48. A method for making a photomask, the method comprising the steps of:
providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;

providing a nozzle tool comprising: a first nozzle and vacuum means adapted to apply and remove a solvent to the top surface of the workpiece adjacent to the periphery; a second nozzle and vacuum means adapted to apply and remove a solvent to the edge of the workpiece; a third nozzle and vacuum means adapted to apply and remove a solvent to the bottom surface of the workpiece adjacent to the periphery, wherein each nozzle may be independently controlled;

controlling the first nozzle and vacuum means, the second nozzle and vacuum means and the third nozzle and vacuum means to selectively apply and remove solvent to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery;

selectively removing photoresist material nonadjacent to the periphery to expose the chrome layer in a first pattern;

removing the exposed chrome layer;

removing the tab of photoresist material, or removing one tab if more than one tab is present;

selectively removing photoresist material nonadjacent to the periphery to expose the chrome layer in a second pattern; and removing the exposed chrome layer.

49. The method of claim 48, wherein the substrate comprises borosilicate glass or fused silica.

50. The method of claim 48, wherein the chrome comprises at least one of the group consisting of chromium, chromium oxide, and a chromium/nitrogen/oxygen containing compound.

51. The method of claim 48, wherein the exposed chrome is removed by a dry etch.

52. The method of claim 48, wherein the exposed chrome is removed by a wet etch.

53. The method of claim 48, wherein the first pattern is formed by writing the pattern into the photoresist with an e-beam.

54. The method of claim 48, wherein the second pattern is formed by writing the pattern into the photoresist with an e-beam.

55. The method of claim 53, wherein the e-beam is grounded to the exposed chrome layer.

56. The method of claim 55, wherein the e-beam is grounded to the chrome layer exposed by removal of the tab.

57. A method for making a photomask, the method comprising the steps of:

providing a workpiece comprising a substrate having a top surface, a bottom surface opposed to the top surface and an edge connecting the surface and the bottom surface, the edge defining a periphery of the substrate, wherein a layer of chrome superimposes the top surface and a layer of a photoresist material superimposes the chrome layer;

applying and removing a solvent selectively to the top surface, bottom surface and edge to dissolve the photoresist material from portions of the workpiece adjacent to the periphery to expose the chrome layer while leaving at least one tab of photoresist material covering the chrome layer adjacent to the periphery;

removing the exposed chrome layer;

removing the tab of photoresist material, or removing at least one tab if more than one tab is present; and removing the exposed chrome layer.

58. The method of claim 57, wherein the substrate comprises borosilicate glass or fused silica.

59. The method of claim 57, wherein the chrome comprises at least one of the group consisting of chromium, chromium oxide, and a chromium/nitrogen/oxygen containing compound.

60. The method of claim 57, wherein the exposed chrome is removed by a dry etch.

61. The method of claim 57, wherein the exposed chrome is removed by a wet etch.

62. A method for making a photomask, the method comprising the steps of:

providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;

applying and removing a solvent selectively to the top surface, bottom surface and edge to dissolve the photoresist material from portions of the workpiece adjacent to the periphery to expose the chrome layer while leaving at least one tab of photoresist material covering the chrome layer adjacent to the periphery;

selectively removing photoresist material nonadjacent to the periphery to expose the chrome layer in a first pattern;

removing the exposed chrome layer;

removing the tab of photoresist material, or removing at least one tab if more than one tab is present;

selectively removing photoresist material adjacent to the periphery to expose the chrome layer in a second pattern; and removing the exposed chrome layer.

63. The method of claim 62, wherein the substrate comprises borosilicate glass or fused silica.

64. The method of claim 62, wherein the chrome comprises at least one of the group consisting of chromium; chromium oxide, and a chromium/nitrogen/oxygen containing compound.

65. The method of claim 62, wherein the exposed chrome is removed by a dry etch.

66. The method of claim 62, wherein the exposed chrome is removed by a wet etch.

67. A method for making a photomask, the method comprising the steps of:

providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;

providing a nozzle tool comprising: means to apply a solvent to the top surface of the workpiece adjacent to the periphery; means to remove the solvent from the edge of the workpiece; and means to apply the solvent to the bottom surface of the workpiece adjacent to the periphery, wherein each means to apply and remove a solvent may be independently controlled; selectively applying and removing solvent by means of the nozzle tool to the top surface and bottom surface of the workpiece thereby removing the photoresist material from portions of the workpiece adjacent to the periphery to expose the chrome layer while leaving at least one tab of photoresist material covering the chrome layer adjacent to the periphery;
removing the exposed chrome layer;
removing the tab of photoresist material, or removing at least one tab if more than one tab is present; and
removing the exposed chrome layer.

68. The method of claim 67, wherein the substrate comprises borosilicate glass or fused silica.

69. The method of claim 67, wherein the chrome comprises at least one of the group consisting of chromium, chromium oxide, and a chromium/nitrogen/oxygen containing compound.

70. The method of claim 67, wherein the exposed chrome is removed by a dry etch.

71. The method of claim 67, wherein the exposed chrome is removed by a wet etch.

72. A method for making a photomask, the method comprising the steps of:
providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;
providing a nozzle tool comprising: a first nozzle adapted to apply a solvent to the top surface of the workpiece adjacent to the periphery; and a second nozzle adapted to apply a solvent to the bottom surface of the workpiece adjacent to the periphery, wherein each nozzle may be independently controlled;
controlling the first and second nozzles to selectively apply solvent to the top surface and bottom surface of the workpiece thereby removing the photoresist material from portions of the workpiece adjacent to the periphery to expose the chrome layer while leaving at least one tab of photoresist material covering the chrome layer adjacent to the periphery;
removing the exposed chrome layer;
removing the tab of photoresist material, or removing at least one tab if more than one tab is present; and
removing the exposed chrome layer.

73. The method of claim 72, wherein the substrate comprises borosilicate glass or fused silica.

74. The method of claim 72, wherein the chrome comprises at least one of the group consisting of chromium, chromium oxide, and a chromium/nitrogen/oxygen containing compound.

75. The method of claim 72, wherein the exposed chrome is removed by a dry etch.

76. The method of claim 72, wherein the exposed chrome is removed by a wet etch.

77. A method for making a photomask, the method comprising the steps of:
providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;
providing a nozzle tool comprising: a first nozzle adapted to apply a solvent to the top surface of the workpiece adjacent to the periphery; a second nozzle adapted to apply a solvent to the bottom surface of the workpiece adjacent to the periphery; a vacuum means adapted to remove a solvent from the edge of the workpiece, wherein each nozzle may be independently controlled;
controlling the first nozzle, the second nozzle and the vacuum means to selectively apply and remove solvent to the top surface and bottom surface of the workpiece thereby removing the photoresist material from portions of the workpiece adjacent to the periphery to expose the chrome layer while leaving at least one tab of photoresist material covering the chrome layer adjacent to the periphery;
removing the exposed chrome layer;
removing the tab of photoresist material, or removing at least one tab if more than one tab is present; and
removing the exposed chrome layer.

78. The method of claim 77, wherein the substrate comprises borosilicate glass or fused silica.

79. The method of claim 77, wherein the chrome comprises at least one of the group consisting of chromium, chromium oxide, and a chromium/nitrogen/oxygen containing compound.

80. The method of claim 77, wherein the exposed chrome is removed by a dry etch.

81. The method of claim 77, wherein the exposed chrome is removed by a wet etch.

82. A method for making a photomask, the method comprising the steps of:
providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;
providing a nozzle tool comprising: means to apply and remove a solvent to the top surface of the workpiece adjacent to the periphery; means to apply and remove the solvent from the edge of the workpiece; and means to apply and remove the solvent from the bottom surface of the workpiece adjacent to the periphery, wherein each means to apply and remove a solvent may be independently controlled;
selectively applying and removing solvent to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery;
selectively removing photoresist material nonadjacent to the periphery to expose the chrome layer in a first pattern;
removing the exposed chrome layer;
removing the tab of photoresist material, or removing one tab if more than one tab is present;
selectively removing photoresist material nonadjacent to the periphery to expose the chrome layer in a second pattern; and
removing the exposed chrome layer.

83. The method of claim 82, wherein the substrate comprises borosilicate glass or fused silica.

84. The method of claim 82, wherein the chrome comprises at least one of the group consisting of chromium, chromium oxide, and a chromium/nitrogen/oxygen containing compound.

85. The method of claim 82, wherein the exposed chrome is removed by a dry etch.

86. The method of claim 82, wherein the exposed chrome is removed by a wet etch.

87. The method of claim 82, wherein the first pattern is formed by writing the pattern into the photoresist with an e-beam.

88. The method of claim 82, wherein the second pattern is formed by writing the pattern into the photoresist with an e-beam.

89. The method of claim 87, wherein the e-beam is grounded to the exposed chrome layer.

90. The method of claim 88, wherein the e-beam is grounded to the chrome layer exposed by removal of the tab.

91. A method for making a photomask, the method comprising the steps of:
providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;
providing a nozzle tool comprising a first nozzle adapted to apply a solvent to the top surface of the workpiece adjacent to the periphery; a second nozzle adapted to remove the solvent from the edge of the workpiece; a third nozzle adapted to apply the solvent to the bottom surface of the workpiece adjacent to the periphery, wherein each nozzle may be independently controlled;
controlling the first, second and third nozzles to selectively apply and remove solvent to the top surface, edge and bottom surface of the workpiece thereby removing the photoresist material from portions of the workpiece adjacent to the periphery to expose the chrome layer while leaving at least one tab of photoresist material covering the chrome layer adjacent to the periphery;
selectively removing photoresist material nonadjacent to the periphery to expose the chrome layer in a first pattern;
removing the exposed chrome layer;
removing the tab of photoresist material, or removing one tab if more than one tab is present;
selectively removing photoresist material nonadjacent to the periphery to expose the chrome layer in a second pattern; and
removing the exposed chrome layer.

92. The method of claim 91, wherein the substrate comprises borosilicate glass or fused silica.

93. The method of claim 91, wherein the chrome comprises at least one of the group consisting of chromium, chromium oxide, and a chromium/nitrogen/oxygen containing compound.

94. The method of claim 91, wherein the exposed chrome is removed by a dry etch.

95. The method of claim 91, wherein the exposed chrome is removed by a wet etch.

96. The method of claim 91, wherein the first pattern is formed by writing the pattern into the photoresist with an e-beam.

97. The method of claim 91, wherein the second pattern is formed by writing the pattern into the photoresist with an e-beam.

98. The method of claim 96, wherein the e-beam is grounded to the exposed chrome layer.

99. The method of claim 98, wherein the e-beam is grounded to the chrome layer exposed by removal of the tab.

100. A method for making a photomask, the method comprising the steps of:
providing a workpiece comprising a substrate having a top surface, a bottom surface opposed to the top surface and an edge connecting the top surface and the bottom surface, the edge defining a periphery of the substrate, wherein a layer of chrome superimposes the top surface and a layer of a photoresist material superimposes the chrome layer;
providing a nozzle tool comprising a first nozzle adapted to apply and remove a solvent to the top surface of the workpiece adjacent to the periphery; a vacuum means adapted to remove a solvent from the edge of the workpiece; a second nozzle and vacuum means adapted to apply a solvent to the bottom surface of the workpiece adjacent to the periphery, wherein each nozzle may be independently controlled;
controlling the first nozzle, the second nozzle and the vacuum means to selectively apply and remove solvent to the top surface and bottom surface of the workpiece and remove solvent from the edge of the workpiece thereby removing the photoresist material from portions of the workpiece adjacent to the periphery to expose the chrome layer while leaving at least one tab of photoresist material covering the chrome layer adjacent to the periphery;
selectively removing photoresist material nonadjacent to the periphery to expose the chrome layer in a first pattern;
removing the exposed chrome layer;
removing the tab of photoresist material, or removing one tab if more than one tab is present;
selectively removing photoresist material nonadjacent to the periphery to expose the chrome layer in a second pattern; and
removing the exposed chrome layer.

101. The method of claim 100, wherein the substrate comprises borosilicate glass or fused silica.

102. The method of claim 100, wherein the chrome comprises at least one of the group consisting of chromium, chromium oxide, and a chromium/nitrogen/oxygen containing compound.

103. The method of claim 100, wherein the exposed chrome is removed by a dry etch.

104. The method of claim 100, wherein the exposed chrome is removed by a wet etch.

105. The method of claim 100, wherein the first pattern is formed by writing the pattern into the photoresist with an e-beam.

106. The method of claim 100, wherein the second pattern is formed by writing the pattern into the photoresist with an e-beam.

107. The method of claim 105, wherein the e-beam is grounded to the exposed chrome layer.

108. The method of claim 107, wherein the e-beam is grounded to the chrome layer exposed by removal of the tab.

* * * * *